(12) United States Patent
Zundel

(10) Patent No.: US 7,759,758 B2
(45) Date of Patent: Jul. 20, 2010

(54) INTEGRATED CIRCUIT HAVING RESISTANCE TEMPERATURE SENSOR

(75) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 483 days.

(21) Appl. No.: 11/624,509

(22) Filed: Jan. 18, 2007

(65) Prior Publication Data

US 2007/0176212 A1 Aug. 2, 2007

(30) Foreign Application Priority Data

Jan. 18, 2006 (DE) .................. 10 2006 002 481

(51) Int. Cl.
*H01L 31/058* (2006.01)

(52) U.S. Cl. .................. 257/467; 257/232; 257/470; 257/E31.052

(58) Field of Classification Search .................. 257/467, 257/470, 232, E31.052
See application file for complete search history.

(56) References Cited

U.S. PATENT DOCUMENTS

| 2003/0021507 A1 | 1/2003 | Hobaugh, II |
| 2003/0210507 A1 | 11/2003 | Pihet et al. |
| 2005/0258464 A1 | 11/2005 | Zundel et al. |
| 2005/0270869 A1 | 12/2005 | Krischke et al. |
| 2005/0275013 A1 | 12/2005 | Sander et al. |
| 2008/0079083 A1* | 4/2008 | Rossi et al. .................. 257/368 |

* cited by examiner

*Primary Examiner*—Phat X Cao
(74) *Attorney, Agent, or Firm*—Dicke, Billig & Czaja, PLLC

(57) ABSTRACT

An integrated circuit having a resistance temperature sensor composed of a first resistance structure formed within a trench, and a second resistance structure formed within a mesa region is disclosed. This embodiment makes it possible to suppress or reduce manufacturing-technological fluctuations of the width of the trenches to a resistance value of the resistance temperature sensor.

10 Claims, 4 Drawing Sheets

PRIOR ART

INTEGRATED CIRCUIT HAVING RESISTANCE TEMPERATURE SENSOR

CROSS-REFERENCE TO RELATED APPLICATIONS

This Utility Patent Application claims priority to German Patent Application No. DE 10 2002006 002 481.8 filed on Jan. 18, 2006, which is incorporated herein by reference.

BACKGROUND

The description relates to an integrated circuit having a resistance temperature sensor, and for semiconductor components.

Power transistors such as DMOS transistors (double diffused metal oxide semiconductor transistors) find multiple application in semiconductor applications. During operation of the power transistors, a wide variety of switching states occur, in which in part very large power losses are converted into heat. Such switching states associated with large power losses are critical since the temperature rises greatly in this case and the power transistors can be destroyed by overheating. In order to protect the transistors against damage in such critical switching states, temperature sensors are often used. Ideally, the temperature sensors are positioned as close as possible to or in the cell array of the power transistor in order that a temperature rise on account of energy loss converted into heat is detected early and rapidly and that the power transistor is turned off in good time before self-destruction on account of overheating byFranz an auxiliary circuit such as a logic circuit. In this case, a resistance situated in the cell array of the power transistor can be used as a rapidly reacting temperature sensor. The temperature sensor changes its absolute resistance value with temperature in the characteristic manner, in which case it is possible to derive a turn-off signal for turning off the power transistor when a defined maximum permissible resistance value is reached. However, this concept with a resistance temperature sensor often fails in practice because of excessively large manufacturing variations with which a resistance temperature sensor of this type can be produced, since the absolute value of the resistance can be used as a turn-off threshold only with difficulty.

In the case of resistance temperature sensors which are integrated into a cell array having trenches and mesa regions lying between the trenches as poly resistance within the trenches or as resistance in the mesa regions, the problem occurs that with the fluctuating width of the trenches or the mesa regions, the resistances fluctuate very greatly with regard to their absolute resistance value. Fluctuations of +/−50% with regard to an average resistance value can occur in this case. However, such large fluctuations prevent a practical use of resistances of this type as a temperature sensor.

For these and other reasons, there is a need for the present invention.

SUMMARY

One embodiment provides an integrated circuit having a resistance temperature sensor, composed of a first resistance structure formed within a trench, and a second resistance structure formed within a mesa region. This makes it possible to suppress or reduce manufacturing-technological fluctuations of the width of the trenches to a resistance value of the resistance temperature sensor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
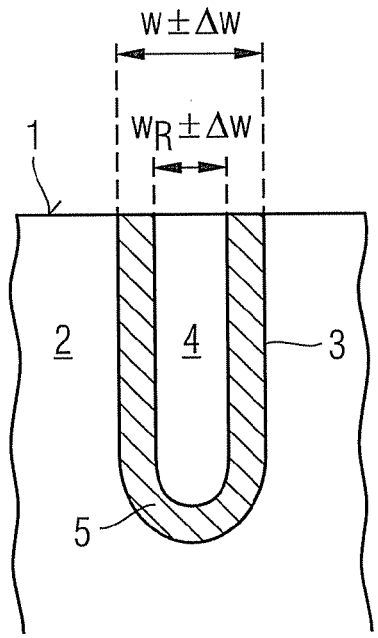
FIG. 1 illustrates schematic cross-sectional views of known resistance temperature sensors.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an integrated circuit having a resistance temperature sensor whose resistance value has small fluctuations under manufacturing conditions would be desirable.

In accordance with one embodiment, an integrated circuit having a resistance temperature sensor is provided having trenches reaching from a surface of a semiconductor substrate into a semiconductor substrate, wherein adjacent trenches are in each case isolated from one another by a mesa region of the semiconductor substrate, a first resistance structure formed within at least one of the trenches, wherein the first resistance structure at least partly adjoins an insulation structure for electrically insulating the first resistance structure from the semiconductor substrate and has at least two first connecting regions for making contact with the first resistance structure, the first connecting regions being electrically isolated from one another, a second resistance structure formed within at least one of the mesa regions, wherein the second resistance structure has at least two second connecting regions that are electrically isolated from one another; and wherein at least one of the first connecting regions is conductively connected to at least one of the second connecting regions.

In one embodiment, the semiconductor substrate is formed as a silicon substrate. This may be a silicon wafer or a silicon wafer with an applied semiconductor layer such as an epitaxial layer. However, the semiconductor substrate may also be formed from further semiconductor materials such as SiGe or III-V semiconductors such a GaAs. The trenches in the semiconductor substrate are for example also used outside the regions occupied by the resistance temperature sensor, for realizing further useful components such as trench transistors, for instance. It is likewise conceivable to provide the trenches with adjoining mesa regions for realizing precise resistance temperature sensors, as would be the case for example in a planar MOSFET (Metal Oxide Semiconductor Field Effect Transistor) technology. The insulation structure may be a field insulation structure made of $SiO_2$, for example. Further insulating materials such as, for instance, $Si_3N_4$, $Al_2O_3$, $Ta_2O_5$, $TiO_2$, high-k materials or low-k materials are likewise possible as insulation structure. The first and the second resistance structure have a similar resistance value and are different from an insulator. Since the at least two first (and respectively second) connecting regions are in each case electrically isolated from one another, apart from the resistance structure they are not conductively connected to one another via a conductive plane within a metallization and wiring region such as a metal layer. However, there is a conductive connection between the first and the second resistance structure.

Since adjacent trenches can be produced with a constant distance, i.e. pitch, in terms of manufacturing technology, manufacturing fluctuations affect particularly the width of the trenches or the mesa regions. An increase/decrease in the width of the trenches entails a decrease/increase in the width of the mesa regions. If the resistance temperature sensor is then constituted by combination of the first resistance structure in the trench and the second resistance structure in the mesa region, it is possible to reduce the influence of such manufacturing fluctuations with regard to variations of the resistance value of the resistance temperature sensor. It is thus possible, by way of example, to counteract an increase in the resistance of the first resistance structure on account of a manufacturing-technologically dictated smaller width of the trench by Franz a correspondingly smaller resistance value of the second resistance structure owing to a corresponding increase in the width of the mesa region.

In another embodiment, the first resistance structure and the second resistance structure are connected in parallel with one another. Such a parallel connection can be obtained in a simple manner for example by a first one of the first connecting regions being conductively connected to a first one of the second connecting regions and a second one of the first connecting regions being conductively connected to a second one of the second connecting regions. A parallel connection of a first and second resistance structure for manufacturing fluctuations since an equivalent resistance of the resistance temperature sensor assuming a constant product of sheet resistance (in ohms/square) and length of the resistance relative to the first and second resistance structures depends only on the pitch of adjacent trenches and no longer on the width of the trenches of the mesa regions.

The first resistance structure and the second resistance structure may be connected up to one another in series.

In accordance with another embodiment, an interconnection of the first and second resistance structures has both a series connection between parts of the first and second resistance structures and a parallel connection between further parts of the first and second resistance structures.

By way of example, the first resistance structure conductively adjoins one of the second connecting regions of the second resistance structure in at least one of the first connecting regions via a sidewall of the trench. An interconnection of the connecting regions with the aid of contact plugs and a metallization level is unnecessary in this case. Such a connection can be obtained for example by the insulation structure within the trench being partly removed again prior to filling with a material for forming the first resistance structure, with the result that a side wall region to the semiconductor substrate or the second semiconductor structure is uncovered. This type of interconnection is suitable in particular for meandering series connection of first and second resistance structures.

In another embodiment, the first resistance structure and the second resistance structure are contact-connected in at least one of the associated first and second connecting regions via the surface. What are suitable for the contact-connection are, by way of example, contact plugs which are formed within an insulation layer and which directly make contact with the resistance structures on one side and conductively adjoin a metallization layer, for example, on another side opposite the one side.

By way of example, at least one electrode is formed within the at least one trench in addition to the first resistance structure, wherein the electrode is electrically insulated from the first resistance structure by a further insulation structure. The electrode may be a gate electrode provided for controlling the conductivity of a channel in MOSFET. It is likewise conceivable for a plurality of electrodes to be provided within the at least one trench in addition to the first resistance structure. Consequently, one or a plurality of field electrodes may also be provided alongside the gate electrode. The elements of resistance structure and electrode, which are electrically insulated from one another, the elements being stacked one above another within the trench, can be led in an edge region of the trench to the surface for contact-connection. It is likewise conceivable to form the first resistance structure within the at least one trench continuously as far as the surface.

In another embodiment, the first resistance structure is formed from polysilicon. A conductivity of the polysilicon can be obtained for example by introducing suitable dopant elements. However, the first resistance structure is not restricted to polysilicon, rather it may include further conductive materials such as metals or further doped semiconductor materials.

The second resistance structure may also be formed as a well zone provided with dopant elements. The dopant elements may be introduced for example by implantation or diffusion into the semiconductor substrate for forming the well zone. The specific conductivity of a well zone formed with dopant elements as a resistance structure depends for example on a dopant concentration and also on the conductivity type, i.e. n type or p type. It is possible to form the well zone as far as the surface of the semiconductor substrate. However, it is likewise conceivable for the well zone to be a buried well zone produced for example by deep implantation of dopant elements. The second resistance structure extends for example over an entire width of a mesa region, i.e. between opposite trenches and in a manner adjoining the latter.

In another embodiment, the well zone is electrically insulated from the semiconductor substrate by at least one pn junction. If the well zone is realized for example as a p-type well zone in an n-type semiconductor substrate, then a single pn junction is present for electrically insulating the well zone from the semiconductor substrate. In this case, the p-type well zone may be formed for example as a body region and the n-type semiconductor substrate may be formed for example as an epitaxial layer. It is likewise possible for the well zone to be electrically insulated from the semiconductor substrate byFranz two pn junctions. With regard to the above example, the well zone could be realized for instance as an n-type source region within the p-type body region. In this case, a first pn junction is present between the well zone and the body region, while a second pn junction is present between the body region and the semiconductor substrate. If the well zone is electrically insulated from the semiconductor substrate byFranz two or more pn junctions, then care should be taken to ensure that a voltage drop across the second resistance structure that is caused in the event of a current flow through the second resistance structure formed as a well zone does not cause triggering of parasitic bipolar transistors. Such a parasitic bipolar transistor in relation to the above example of two pn junctions would be an npn transistor whose emitter is provided by the well zone, whose drain is provided by the body region and whose collector is provided by the semiconductor substrate. In order to counteract such triggering of a parasitic bipolar transistor, suitable potentials can be applied to the semiconductor zones forming emitter, base and collector. By way of example, the well zone formed as n type in the above example could be put at a suitably high potential, so that the well zone, even in the event of current loading, has a higher potential value at every location than the body region.

In another embodiment, the second resistance structure is formed as conductive material within a cutout in the mesa region. Such a cutout can be produced for example by etching back the mesa region. The conductive material for forming the second resistance structure can be introduced into the remaining gap. By way of example, a metal or a semiconductor material such as polycrystalline silicon may be used as conductive material.

In accordance with another embodiment, the first resistance structure and the second resistance structure have one or more matching dopant elements, and a dopant profile directed into the semiconductor substrate perpendicular to the surface within the first and the second resistance structure essentially matches. If the matching dopant elements determine the conductivity both of the first and of the second resistance structure, the advantage that can be obtained with this embodiment is that the resistivity of the two resistance structures matches. This has a particularly favorable effect on a compensation of manufacturing fluctuations upon variation of the widths of trenches and mesa regions.

In one embodiment, the first and the second resistance structure are formed in strip-type fashion. The strips may for example be integrated into a strip-type cell array of a power transistor. A manufacturing-technologically dictated fluctuation of the width of the resistance structure formed in a trench accordingly has an effect in the opposite direction on the width of the second resistance structure that is formed in the mesa region, which helps in compensation of the manufacturing fluctuation with regard to the absolute value of the resistance of the resistance temperature sensor.

By way of example, the first resistance structure is constructed from a plurality of resistance strips that run parallel to one another, wherein the resistance strips are interconnected in series or in parallel. If the second resistance structure is constructed from a plurality of resistance strips that run parallel to one another, wherein the resistance strips are interconnected in series or in parallel. Such a series or parallel connection of the resistance strips can be realized by further connecting regions along the strips. By way of example, the strips can be contact-connected and connected to one another via the surface of the semiconductor substrate. ByFranz a suitable series or parallel connection of resistance strips of the first and/or second resistance structure, it is possible, in the event of mutually deviating resistivities of the first and second resistance structures, for the absolute values of the resistances of the first and second resistance structures to be matched to one another, with the result that the influence of manufacturing fluctuations on the absolute value of the resistance temperature sensor composed of first and second resistance structures is suppressed or kept small.

In accordance with another embodiment, a resistance value of the first resistance structure deviates from the resistance of the second resistance structure by less than 5%, or else by less than 2%. It is thereby possible to achieve a compensation of manufacturing fluctuations on the absolute value of the resistance of the resistance temperature sensor. A parallel connection of first and second resistance structures leads to a compensation of manufacturing fluctuations with regard to the width of trenches and mesa regions.

By way of example, the first resistance structure or parts thereof and the second resistance structure or parts thereof are formed in trenches and mesa regions that directly adjoin one another. This entails the advantage that possible temperature fluctuations in a direction parallel to the surface lead to vanishing or negligibly small temperature fluctuations within the first and second resistance structures. If the resistance structures emerge from a series or parallel connection of resistance strips, then the trenches and mesa regions containing the resistance strips correspondingly adjoin one another.

The first and the second resistance structure may be positioned within a cell array of a power transistor or in direct proximity to the cell array. An overheating of the power transistor can thereby be rapidly detected byFranz the resistance temperature sensor.

An embodiment of a method for producing a resistance temperature sensor has the processes of providing the semiconductor substrate having the trenches and the insulation structure, introducing undoped polysilicon into the at least one trench, jointly introducing dopant elements both into the polysilicon for the formation of the first resistance structure and into the at least one mesa region for the formation of the second resistance structure and forming a conductive connection between first and second resistance structure. By jointly introducing the dopant elements, for instance by implantation or diffusion, it is possible to obtain a common dopant profile within the polysilicon of the first resistance structure and in the mesa region of the second resistance structure. It is thereby possible to obtain the advantage of matching resistivities of the first and second resistance structures, which has an effect on the suppression or reduction of the influence of manufacturing fluctuations on the absolute value of the resistance value of the resistance temperature sensor.

In order to suitably configure the use of resistances integrated in a cell array or a mesa region as temperature sensors, it is possible to use in each case a pair, or multiples thereof, having polyresistance in the trench and body resistance in the directly adjacent mesa region as a temperature sensor. This entails the advantage that the manufacturing fluctuations explained in the introduction can be averaged out because whenever e.g., the trench width and hence the poly width increase, the mesa width decreases by the same magnitude, and vice versa. In accordance with the exemplary calculation presented below, the total resistance thus becomes independent of the trench width fluctuation and the mesa width fluctuation. The total resistance is now determined by quantities that are reproducible very well, such as e.g., the pitch (instead of trench width or mesa width). The exemplary calculation below assumes that the products of resistivity and length of the resistance for polysilicon and body are equal in magnitude. The (penetration) depth of the two resistances is likewise intended to be as far as possible equal in magnitude. These boundary conditions give rise to the proposal for a possible production method: an undoped polysilicon is deposited instead of an n+-doped polysilicon in the trench. The polysilicon in the regions of power transistor cells is doped in the later course of the process byFranz an n+-type source implantation and drive-in, in which case the regions of the temperature sensor should not be implanted (a source mask that is present must be shaded there). During the body implantation, implantation is then effected into the DMOS regions as usual and into the temperature sensor regions both into the undoped trench poly and into the directly adjacent mesa region and thermal drive-out is subsequently effected in order to obtain conditions that are as identical as possible there (with regard to depth, resistivity). A length can be matched byFranz a layout.

One embodiment consists in the combined application of directly adjacent resistances within a pitch as temperature sensors. This makes it possible to significantly reduce large manufacturing fluctuations and actually to provide the application as a temperature sensor in a practical fashion in the first place.

The compensation of manufacturing-technologically dictated fluctuations in the width of the poly and the mesa region shall be illustrated further on the basis of the exemplary calculation that follows.

Exemplary calculation:

Consider a parallel connection of a polysilicon resistance $R_{poly}$ in the trench with a body resistance $R_{Body}$ in the mesa region. A total resistance $R_{tot}$ results as $$1/R_{tot} = 1/R_{poly} + 1/R_{Body}.$$

With $A_P$ and $A_B$ as cross-sectional areas of the resistances of poly and body, $\rho_P$ and $\rho_B$ as resistivities and $1_P$ and $1_B$ as lengths of the resistances of poly and body, the total resistance results as $$1/R_{tot} = A_P/\rho_P \cdot 1_P + A_B/\rho_B \cdot 1_B$$

If it is assumed that $\rho_P \cdot 1_P = \rho_B \cdot 1_B = \rho \cdot 1$ holds true, it follows that:

$$1/R_{tot} = (A_P + A_B / \rho \cdot 1).$$

$A_P = T_{Trench} \cdot B_P$, $A_B = T_{Body} \cdot (\text{Pitch} - B_P)$ holds true, where $T_{Trench}$ and $T_{Body}$ denote the depths of the resistance in the trench and of the body region, respectively, $B_p$ is the width of the body region in the trench, and Pitch denotes the distance between adjacent trenches. If the depths of the resistances in the trench and mesa region match, i.e. $T_{Trench} = T_{Body}$, the following results:

$$1/R_{tot} = T_{Body} \cdot \text{Pitch}/\rho 1.$$

Accordingly, a manufacturing-dictated fluctuation of the parameter $B_p$ under the above preconditions does not affect the total resistance of the temperature sensor.

A possible method for setting $\rho$, 1, $T_{Body}$ as exactly as possible is afforded by deposition of undoped polysilicon, in particular in the trenches for forming the polyresistance, and body implantation with subsequent annealing/activation of the dopants, the implantation being effected simultaneously into the mesa region and into the undoped polysilicon of the trench in order to form polyresistance and resistance in the mesa region. A doping of the polysilicon initially in particular as gate poly of MOSFETs may be effected for example with the aid of an n+-type source implantation, in which case, during this process, the regions of the resistance temperature sensor are not implanted, i.e. the corresponding regions are shaded.

The resistances form in strip-type fashion and to connect a poly resistance in the trench in parallel with a plurality of source resistances in adjacent mesa regions. The source resistance is defined by the resistivity of the source region. As a result, manufacturing fluctuations can be kept small even in the case of different values of $\rho \cdot 1$ byFranz a single polyresistance in the trench being connected in parallel with a plurality of mesa resistances formed as source regions.

The number of polyresistances in the trench and the number of sheet resistances in the mesa region which are combined with one another to form a resistance temperature sensor can be chosen freely and can be optimized with regard to minimal overall fluctuations. The polyresistances in the trench may be formed both with a thick oxide (for instance field oxide) in the trench and with a gate oxide (thin oxide) in the trench or with a combination of thick oxide and gate oxide (thin oxide) in the trench. Generally, it is also possible to use further conductive materials instead of the poly in the trench. For this purpose, the poly may also be partly or wholly etched out from the trench, after which the latter is filled with the new material. The resistances in the mesa region can be produced by various types of dopant regions, n-type and p-type dopings such as, for example, for the body region and the source region, but generally it is possible to use any desired dopant region or else further conductive materials which, for example, are filled into the remaining mesa gaps after a mesa etching-back. The filling into the mesa may be effected for example with a metal or a polysilicon. In order to avoid a harmful effect of parasitic components that may arise within the combined temperature sensor (e.g., parasitic npn bipolar transistor in the above exemplary embodiment with source resistance), the entire region of the combined temperature sensor can be connected byFranz optimized circuit technologies; by way of example, in terms of the potential, the temperature sensor may always be operated in the vicinity of the MOSFET drain potential or the MOSFET itself may be clamped byFranz a zener protection circuit such that the drain potential does not reach the critical voltage for avalanche generation. The combined temperature sensor can be used in any semiconductor components in which the temperature is to be detected, and is therefore not restricted to a MOSFET.

Structurally or functionally similar or identical elements or material regions are designated by the same reference symbols below, without a detailed discussion of their properties being repeated upon every occurrence in the description or in the Figures.

FIG. 1a illustrates a schematic cross-sectional view of a known resistance temperature sensor. From a surface 1 of a semiconductor substrate 2, a trench 3 projects into the semiconductor substrate 2. A resistance structure 4 is formed within the trench 3, and is electrically insulated from the semiconductor substrate 2 by an insulation structure 5. A trench width w is subject to a manufacturing-technological fluctuation of the trench width by Δw. Since a thickness of the insulation structure 5 can be produced in manufacturing-technologically reproducible fashion, the manufacturing-technological fluctuation of the trench width Δw affects the width $w_R$ of the resistance structure 4. In the Figure, the manufacturing-technological fluctuation of the width of the resistance structure is approximately equated with the manufacturing-technological fluctuation of the trench width Δw.

Figure 1B:
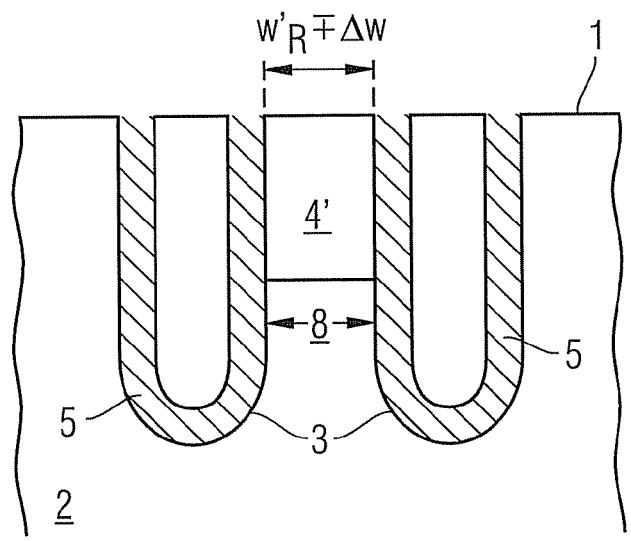

FIG. 1b illustrates a schematic cross-sectional view of a further known resistance structure 4' for realizing a resistance temperature sensor. The resistance structure 4' is formed as a well zone in the semiconductor substrate 2. The resistance structure 4' may be a body region, for example. The conductivity type of the resistance structure 4' is opposite to the conductivity type of the semiconductor substrate 2. By way of example, the resistance structure 4' is a p-type body region, and the semiconductor substrate 2 is an n-type epitaxial layer. In terms of magnitude, a manufacturing-technological fluctuation of the width of the mesa region Δw is equal in magnitude to the manufacturing-technological fluctuation of the trench width Δw. The width of the resistance structure $w'_R$ fluctuates by Δw.

The fluctuation Δw greatly affects the cross-sectional area of the resistance structures 4, 4' and hence the absolute value of the resistance temperature sensor formed on the basis of the resistance structures 4, 4'.

Figure 2:
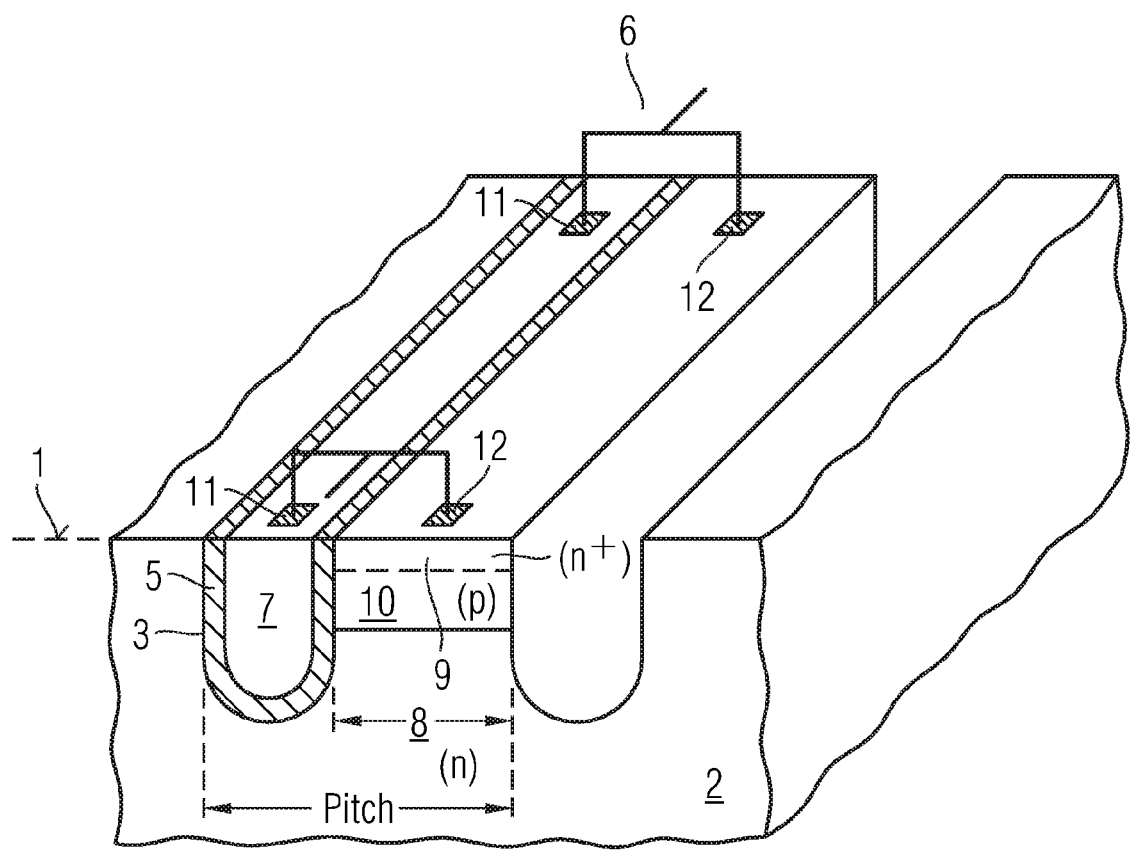
FIG. 2 illustrates a schematic cross-sectional view of a resistance temperature sensor in accordance with a first embodiment of the invention.

FIG. 2 illustrates a schematic cross-sectional view of a resistance temperature sensor 6 in accordance with an embodiment of the invention. For the sake of clarity, only those elements which serve for understanding the invention are highlighted. The resistance temperature sensor 6 has a first resistance structure 7 formed within the trench 3, and also a second resistance structure 9 formed within an adjoining mesa region 8. The first resistance structure 7 within the trench 3 is electrically insulated from the semiconductor substrate 2 by the insulation structure 5. The second resistance structure 9, which is formed as a well zone of the n+ conductivity type, is embedded in the mesa region 8 within a further well zone 10 of the p conductivity type. The further well zone 10 may be a body region, for example. The further well zone 10, for its part, adjoins the semiconductor substrate 2 of the n conductivity type. The second resistance structure 9 is thus isolated from the semiconductor substrate 2 by two pn junctions. The first resistance structure 7 is formed as a doped polysilicon layer, for example. The first resistance structure 7 is connected up in parallel with the second resistance structure 9 via first and second connecting regions 11, 12. The interconnection—illustrated in greatly simplified fashion—between first resistance structure 7 and second resistance structure 9 may be effected for example byFranz conductive contact plugs that connect the respective resistance structure 7, 9, contact plugs of the first and second connecting regions 11, 12 in each case being connected up in pairs for instance with the aid of a metallization level (see interconnection outlined in greatly simplified fashion in FIG. 2).

A manufacturing-technologically dictated fluctuation of the trench width and hence of the resistance of the first resistance structure 7 is now compensated for by an opposite fluctuation of the width of the mesa region and hence an oppositely directed fluctuation of the resistance of the second resistance structure 9. It is thus possible to counteract a fluctuation in the resistance value of the resistance temperature sensor 6 in the case of fluctuation of the trench width.

Figure 3:
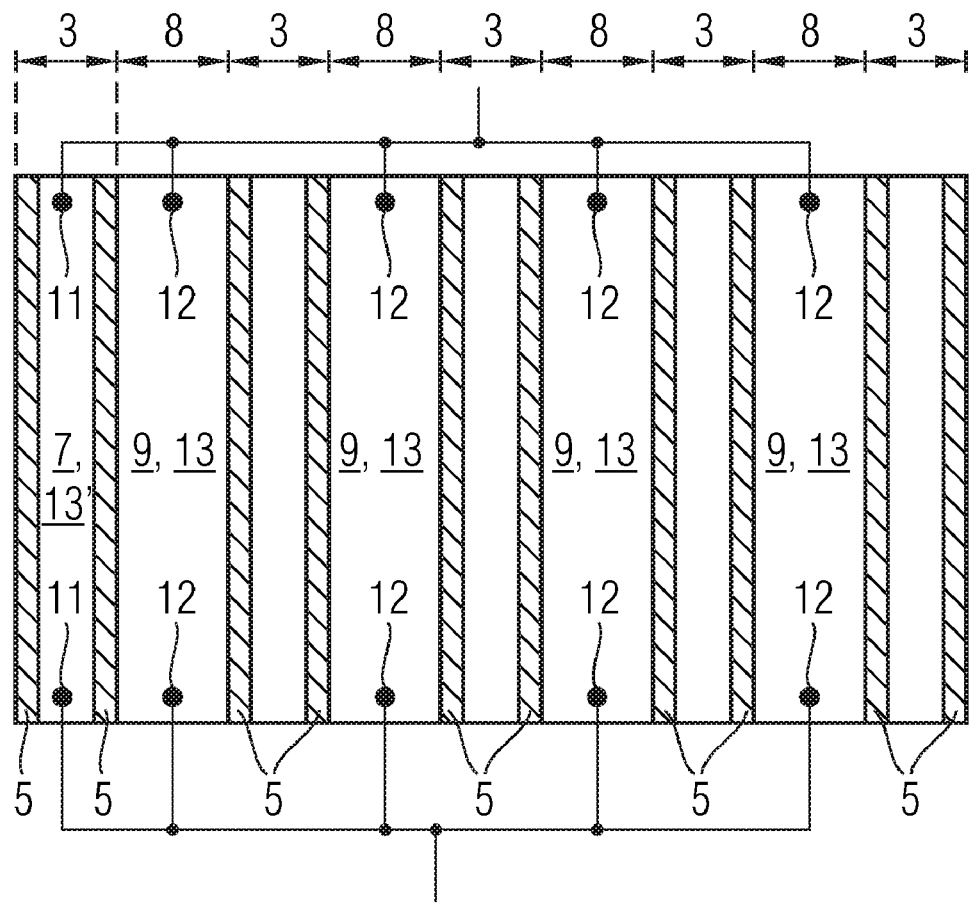
FIG. 3 illustrates a schematic plan view of a resistance temperature sensor in accordance with a further embodiment of the invention.

FIG. 3 illustrates a schematic plan view of a resistance temperature sensor in accordance with a further embodiment of the invention. First resistance structure 7 and second resistance structure 9 are connected in parallel in accordance with the embodiment illustrated in FIG. 2. In contrast to the first embodiment, however, the second resistance structure 9 is itself composed of a plurality of resistance strips 13 connected in parallel. The parallel connection of first and second resistance structures each having a different number of resistance strips 13, 13' makes it possible for the absolute resistance values of first resistance structure 7 and second resistance structure 9 to be matched to one another in a simple manner. Trenches which lie between adjacent resistance strips 13 of the second resistance structure 9 and within which no first resistance structure 7 is formed may be filled for example with the material of the first resistance structure 7, but may be free of potential, i.e. floating, or be connected to a defined potential, with the result that they are not part of the resistance temperature sensor 6. It is likewise possible to construct the first resistance structure 7 from more resistance strips 13' in comparison with the number of resistance strips 13 of the second resistance structure 9. The resistance strips 13, 13' may be connected up to one another both in parallel and in series and it is likewise possible for resistance strips that are connected in parallel to be connected in series with further resistance strips. What is common to all possible interconnection possibilities of the resistance strips, however, is an interconnection between first resistance structure 7 and second resistance structure 9.

Figure 4:
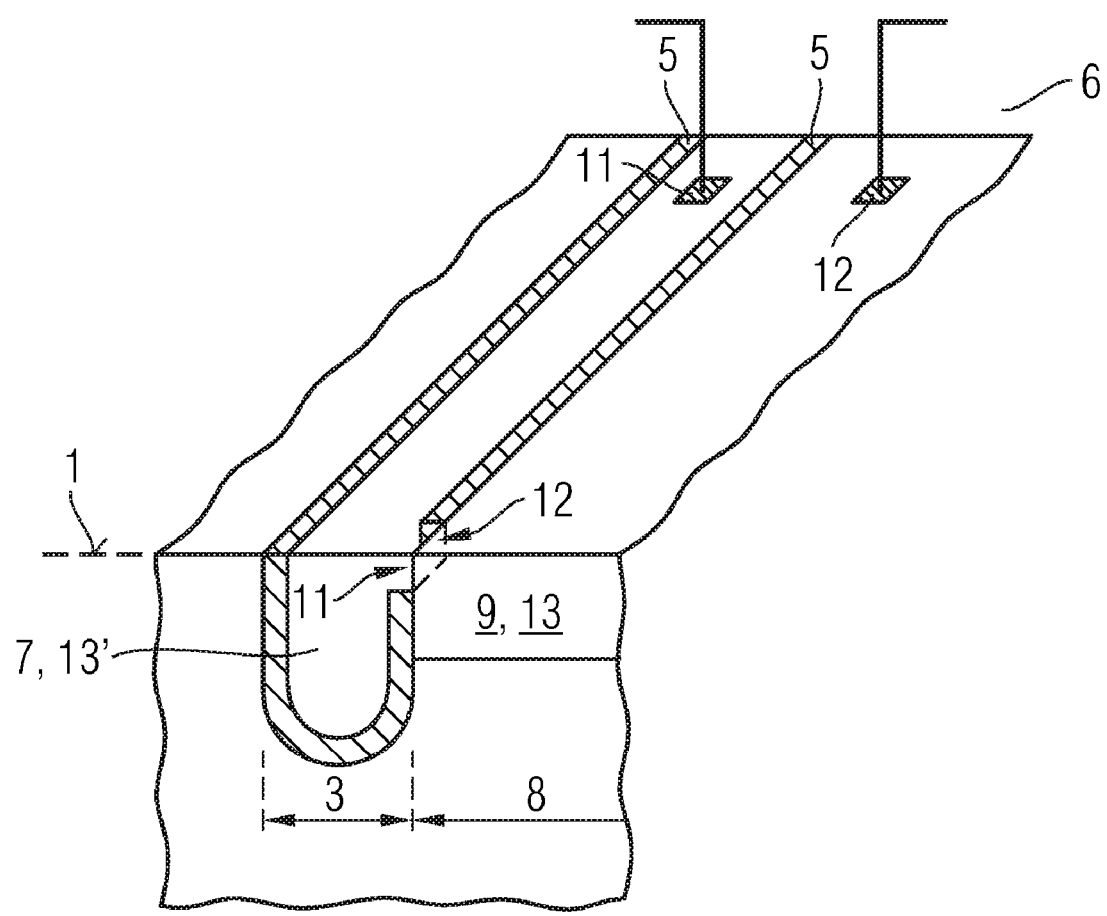
FIG. 4 illustrates a schematic cross-sectional view of a resistance temperature sensor in accordance with a further embodiment of the invention.

FIG. 4 illustrates a schematic cross-sectional view of a resistance temperature sensor in accordance with a further embodiment of the invention. In this case, the first resistance structure 7 is formed as resistance strip 13' within the trench 3 and the second resistance structure 9 is likewise formed as resistance strip 13 in the form of a well zone in the mesa region 8. In this case, as also in the case of the previous first and second embodiments in FIGS. 2 and 3, the resistance strip 13 of the second resistance structure 9 adjoins the trench 3 containing the first resistance structure 7. At one end of the resistance strips 13, 13', the insulation structure 5 that electrically insulates the first resistance structure 7 from the semiconductor substrate 2 is partly removed, with the result that, in this region, the first resistance structure 7 conductively adjoins the second resistance structure 9 via a side wall of the trench 3. Both one of the first connecting regions 11 of the first resistance structure 7 and one of the second connecting regions 12 of the second resistance structure 9 are formed in this region. A respective further first and second connecting region is situated at the opposite end of the resistance strips 13, 13'. The contact-connection of the two resistance strips, i.e. the contact-connection of the resistance temperature sensor 6, is effected in this region. The two resistance strips 13, 13' of the first and second resistance structures 7, 9 are accordingly connected up to one another in series in the region of the cutout of the insulation structure 5. It is also possible for the series interconnection of the resistance strips 13 to extend over a multiplicity of adjacent trenches 3 and mesa regions 8 in order to obtain suitable absolute resistance values. The strips may be connected to one another in meandering fashion, by way of example.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor having a resistance temperature sensor comprising:
   trenches reaching from a surface of a semiconductor substrate into the semiconductor substrate, wherein adjacent trenches are isolated from one another by a mesa region of the semiconductor substrate;
   a first resistance structure formed within at least one of the trenches, wherein the first resistance structure at least partly adjoins an insulation structure for electrically insulating the first resistance structure from the semiconductor substrate and has at least two first connecting regions for making contact with the first resistance structure, the first connecting regions being electrically isolated from one another;

a second resistance structure formed within at least one of the mesa regions, wherein the second resistance structure has at least two second connecting regions that are electrically isolated from one another; and wherein at least one of the first connecting regions is conductively connected to at least one of the second connecting regions, wherein the first resistance structure and the second resistance structure are connected in parallel with one another.

2. The semiconductor as claimed in claim 1, comprising wherein the first resistance structure and the second resistance structure are contact-connected in at least one of the associated first and second connecting regions via the surface.

3. The semiconductor as claimed in claim 1, comprising wherein the first resistance structure is formed from polysilicon.

4. The semiconductor as claimed in claim 1, comprising wherein the second resistance structure is formed as a well zone provided with dopant elements.

5. The semiconductor as claimed in claim 4, comprising wherein the well zone is electrically insulated from the semiconductor substrate by at least one pn junction.

6. The semiconductor as claimed in claim 4, comprising wherein the second resistance structure is formed as conductive material within a cutout in the mesa region.

7. The semiconductor as claimed in claim 1, comprising wherein the first resistance structure and the second resistance structure have one or more matching dopant elements; and a dopant profile directed into the semiconductor substrate perpendicular to the surface within the first and the second resistance structure essentially matches.

8. The semiconductor as claimed in claim 1, comprising wherein a resistance value of the first resistance structure and the resistance value of the second resistance structure deviate from one another by less than 5%.

9. The semiconductor as claimed in claim 1, comprising wherein a resistance value of the first resistance structure and the resistance value of the second resistance structure deviate from one another by less than 2%.

10. The semiconductor as claimed in claim 1, comprising wherein the first resistance structure or parts thereof and the second resistance structure or parts thereof are formed in trenches and mesa regions that directly adjoin one another.

* * * * *